United States Patent [19]

Shah et al.

[11] 4,210,883
[45] Jul. 1, 1980

[54] TECHNIQUE FOR WIDENING THE TEMPERATURE RANGE OF SURFACE ACOUSTIC WAVE REFLECTION ARRAY FILTERS

[75] Inventors: Manhar L. Shah, Melbourne Beach; William D. Hunt, Palm Bay, both of Fla.

[73] Assignee: Harris Corporation, Cleveland, Ohio

[21] Appl. No.: 919,626

[22] Filed: Jun. 27, 1978

[51] Int. Cl.² .......................... H03H 9/26; H03H 9/32
[52] U.S. Cl. ............................... 333/195; 310/313 D; 333/196
[58] Field of Search .......................... 333/193–196, 333/150–155; 364/821–822; 330/5.5; 331/107 A; 310/313

[56] References Cited

U.S. PATENT DOCUMENTS

| | | | |
|---|---|---|---|
| 3,883,831 | 5/1975 | Williamson et al. | 310/313 X |
| 3,978,437 | 8/1976 | Paige | 310/313 X |
| 4,055,820 | 10/1977 | Solie | 310/313 X |
| 4,146,852 | 3/1979 | Godfrey et al. | 333/196 |

OTHER PUBLICATIONS

Meyer et al.—"Reflective Surface Acoustic Wave Delay Line Material Parameters" in IEEE Ultrasonics Symposium Proceedings, 1973; pp. 500–502.

Primary Examiner—Alfred E. Smith
Assistant Examiner—Marvin Nussbaum
Attorney, Agent, or Firm—Craig & Antonelli

[57] ABSTRACT

For widening the temperature range of a reflective array device configured on a substrate having an anisotropic temperature coefficient of delay, such as ST-quartz material, so that the signal strength does not decrease appreciably as the temperature of the device is changed over a broad range, the structural shape of the reflective array is configured such that the reflection angles of the discontinuity-creating surface structure vary across the reflecting edges of the discontinuity stripe (e.g. groove or rib) pattern. In one embodiment, the stripe pattern of the grating may be varied so that the reflection angles vary for alternating stripes. In another embodiment, opposite edges of a stripe may be non-parallel so that the reflection angles vary for each stripe. It is also possible to amplitude weight the frequency response characteristic of a grating by controlling the physical structure of the individual stripes of which a grating pattern is formed. The use of a dot array configuration is especially advantageous in this regard since amplitude weighting can be achieved simply by controlling the dot array density of each stripe, implemented in a straightforward manner by suitable design of the grating mask.

35 Claims, 10 Drawing Figures

TECHNIQUE FOR WIDENING THE TEMPERATURE RANGE OF SURFACE ACOUSTIC WAVE REFLECTION ARRAY FILTERS

FIELD OF THE INVENTION

The present invention relates to surface acoustic wave (SAW) reflective devices, particularly those incorporating substrate material, having an anisotropic temperature coefficient of delay, such as ST-quartz and is especially directed to a technique and strucarrangement for widening the temperature range of SAW reflective array filters.

BACKGROUND OF THE INVENTION

Among materials which may be employed as acoustic wave transmitting materials in SAW devices are materials such as lithium niobate and ST-quartz. ST-quartz has been found to be particularly suitable because it has a zero temperature coefficient of delay at room temperature for X-axis SAW propagation, thereby providing negligible delay changes due to variations in the temperature of the device. As a result, temperature control of a device constructed of ST-quartz is either unnecessary or a simple on-off heater has been found to be adequate. Unfortunately, however, problems arise when employing ST-quartz in a reflective array structure.

More specifically, in a reflective array structure such as a reflective array filter, the grating angle is determined in accordance with the ratio of two orthogonal SAW velocities. In ST-quartz, since the temperature coefficient of delay in a direction perpendicular to the X-direction is 47 ppm/°C., the SAW velocities in two orthogonal directions change by different amounts approximately equal to 47 ppm/°C. Therefore, the optimum grating angle undergoes a change as the operating temperature of the device is varied due to differential time delay changes and different linear expansions in the two respective orthogonal directions, design of the mask used to fabricate the ST-quartz device must incorporate a correction for this temperature differential effect, which necessitates a knowledge of fabrication and operating temperatures of the device beforehand. Thus, even though a conventional reflective array device constructed on ST-quartz may operate well at the temperature for which operation of the device was designed and will show little change in delay as the temperature is changed, the response of the device will fall off as the temperature deviates from the designed operating temperature. This roll-off as a function of temperature is depicted in FIG. 1, which is a graphic plot of signal loss versus temperature of a reflective array formed on an ST-quartz substrate, as reported in an article by P. C. Meyer and M. B. Schulz, entitled "Reflective SAW delay Line Material Parameters" in Ultrasonic Simposium Proceedings, page 500 (1973).

As is illustrated in FIG. 1 and reported in the above article, an ST-quartz grating suffers a 15 dB decrease in signal strength as the temperature is changed from −28° C. to +42° C. For some applications, this signal loss temperature profile is unacceptable, so that a conventionally configured grating must be modified or corrected in an effort to reduce the temperature sensitivity of the device.

Typically, the configuration of a reflective array, such as grating 1 or 2 as shown in FIG. 2, comprises a plurality of stripes 11, 12 configured as grooves or ribs formed in or on, respectively, a wave conducting material 15, such as ST-quartz. The pattern of the grooves or ribs by way of which the surface wave reflecting-discontinuities are created in the material is such that the opposite edges 11a, 11b, 12a, 12b of each rib or groove are parallel with each other and the separation 13 between opposing edges of adjacent grooves is constant along the grooves. As a result, for any direction of propogation of a surface wave, such as transmitted from transducer 18 along direction 14 and reflected by the array gratings 1 and 2 to be directed along direction 16 and received by transducer 19, the angle of incidence $\theta$ of the wave is the same for each stripe and at each point of incidence in each stripe. In other words, the grating angle is fixed at a constant value everywhere on the array, so that the array has a temperature sensitivity profile illustrated in FIG. 1.

Various schemes have been proposed to deal with the temperature sensitivity of SAW devices. For example, the U.S. Pat. No. 3,886,484 to Dias describes a substrate of differently located rotated Y-cuts cascaded together to expand the temperature range of the device by inclining plural faces of a device at respectively different angles. The U.S. Pat. No. 3,999,147 to Otto et al describes a device having reflective gratings with propogation directions in which the temperature coefficients of delay are opposite signs. Waves are reflected in two directions along path lengths to provide a summed linear temperature coefficient of delay. The U.S. Pat. Nos. 3,995,240 to Kerbel and 3,952,268 Schulz et al describe temperature-compensated devices in which an overlay of material deposited upon the surface structure is provided in an effort to compensate for temperature variations.

SUMMARY OF THE INVENTION

In accordance with the present invention, there is provided a novel technique of widening the temperature range of a reflective array device configured on material, such as ST-quartz, that has an anisotropic temperature coefficient of delay, so that the signal strength does not decrease appreciably as the temperature of the device is changed over a broad range.

To this end, the structural shape of the reflective array is configured such that the reflection angles of the discontinuity-creating surface structure vary across the reflecting edges of the discontinuity stripe (e.g. groove or rib) pattern. Implementation of this angle distribution may be accomplished in various ways. In one embodiment, the stripe pattern of the grating may be varied so that the reflection angles vary for alternating stripes. In another embodiment, opposite edges of a stripe may be non-parallel so that the reflection angles vary for each stripe. It is also possible to amplitude weight the frequency response characteristic of a grating by controlling the physical structure of the individual stripes of which a grating pattern is formed. The use of a dot array configuration is especially advantageous in this regard since amplitude weighting can be achieved simply by controlling the dot array density of each stripe, implemented in a straighforward manner by suitable design of the grating mask.

Formation of the grooves or ribs may be accomplished by conventional techniques such as metallic or dielectric material deposition, sputtered etch, diffusion, or ion implantation. The grooves and ribs can be continuous or configured as a random dot pattern, the latter facilitating amplitude weighting of the frequency response characteristic, as noted above.

DETAILED DESCRIPTION OF THE INVENTION

Figure 3:
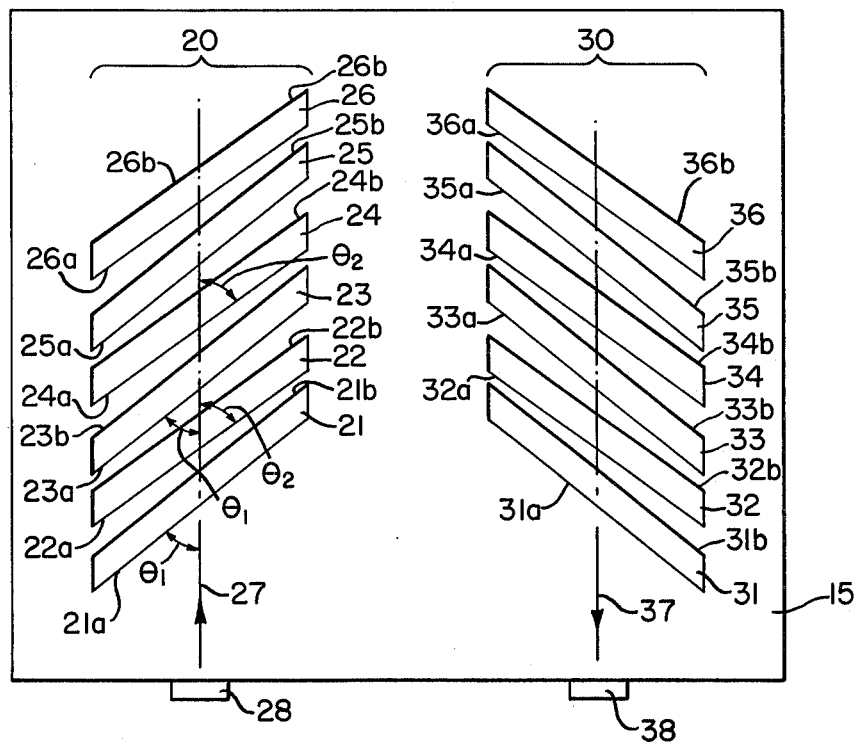
FIG. 3 depicts a grooved grating pattern of a reflective array device in accordance with a first embodiment of the invention.

FIG. 3 illustrates a first embodiment of the present invention in which the surface discontinuity-creating stripes are comprised of a grating pattern of grooves formed in the surface of an acoustic wave propagating medium such as an ST-quartz substrate 15. Two such grating patterns 20 and 30 are shown in FIG. 3, grating pattern 20 being comprised of a plurality of grooves, of which six grooves 21 through 26 are shown, each inclined relative to a direction 27 of transmission of a surface acoustic wave propagated from a suitable transmitter 28 disposed at a first portion of the substrate 15. While transmitter 28 has been illustrated as being edge-bonded to substrate 15, it may also be formed of an interdigital structural arrangement disposed on the surface of substrate 15 in a conventional manner. Transmitter 28 launches along direction 27 a surface acoustic wave that interacts with grating 20 to be reflected toward grating 30.

Grating 30, like grating 20, is comprised of a plurality of grooves, of which six grooves 31 and 36 are shown, each inclined relative to direction 37 of transmission of a surface acoustic wave to be directed toward a suitable receiver 38. Grating 30 is disposed so as to cause surface acoustic waves received from grating 20 to be reflected in direction 37 toward receiver 38 whereat an output signal corresponding to that originally applied to transmitter 28 and modified by the reflections from the gratings 20 and 30 is derived. Like transmitter 28, receiver transducer 38 may be suitably edge-bonded to substrate 15, or may be formed in an interdigital fashion on the surface of substrate 15.

In order to effectively provide a broad, flat signal loss-versus-temperature profile, the angular orientations of the edges of the grooves of grating patterns 20 and 30 are varied along respective directions 27 and 37. In more detail, considering grating pattern 20, the opposite edges of each individual groove, for example, edges 21a and 21b of groove 21 are parallel with each other but are inclined relative to direction 27 at an angle $\theta_1$ which differs from the angle $\theta_2$ at which the edges of an adjacent groove, such as groove 22, intersect direction 27. Thus, parallel edges 22a and 22b of groove 22 intersect the direction of surface wave propagation 27 at an angle $\theta_2$, where $\theta_2 \neq \theta_1$. As an illustrative example, FIG. 3 shows the specific case where the number of differing angular orientations of a grating pattern is equal to two; in this case, the grooves are distributed so that those with differing angles of orientation alternate with one another. Thus, grooves 21, 23, and 25 are parallel with each other, intersecting direction 27 at an angle $\theta_1$, while grooves 22, 24, and 26 are parallel with each other but intersecting direction 27 at a different angle $\theta_2$. In a similar manner, the angular orientations of the edges of the grooves of alternate ones of grating pattern 30, such as grooves 31, 33, and 35, etc., are parallel with one another and intersect acoustic wave propagation direction 37 at an angle $\theta_1$, while grooves 32, 34, 36, etc., are parallel with one another and intersect acoustic wave propagation direction 37 at an angle $\theta_2$, to provide a signal loss-temperature profile which corresponds to that of grating pattern 20, whereby temperature dependent variations of the two grating patterns 20 and 30 effectively track each other.

Figure 1:
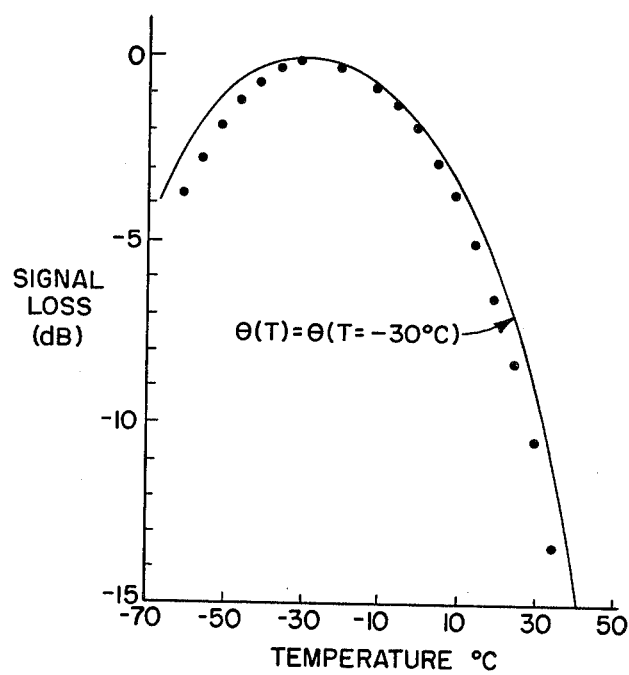
FIG. 1 is a graphic plot of the variation of signal loss with temperature for ST-quartz material.
Figure 4:
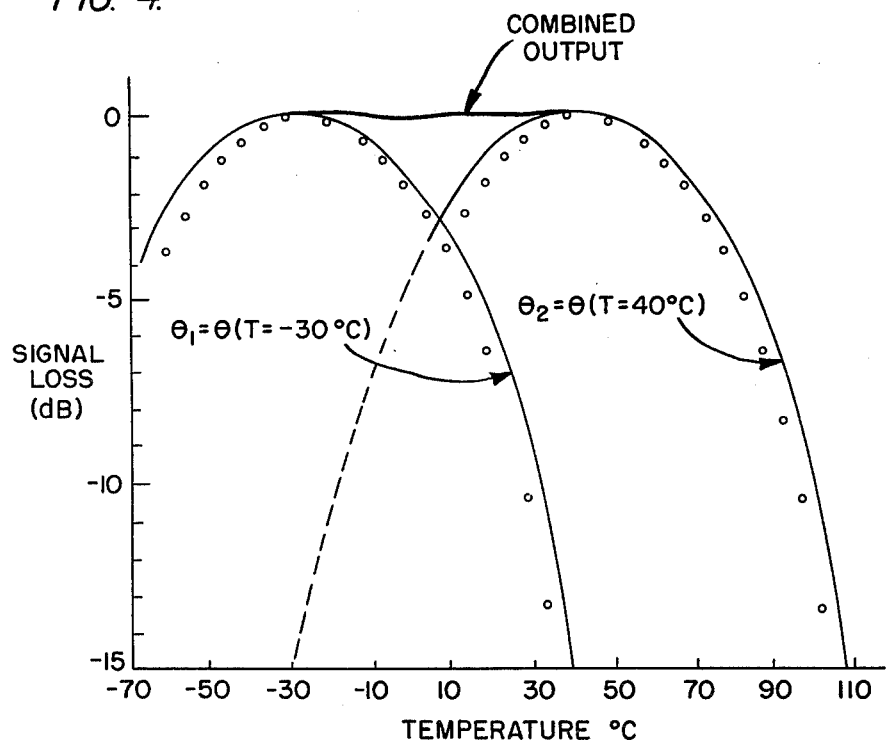
FIG. 4 is a graphic plot of the signal loss versus temperature profile for a distributed angle SAW reflective grating.

The choice of the particular values for angles $\theta_1$ and $\theta_2$ is based upon the relative manufacturing and operating temperatures and may be derived in accordance with the desired expanded temperature profile using the profile definitive equations described in the above Meyer et al publication. In this connection, FIG. 4 illustrates the effect of employing a multiangle configuration of two different angular orientations ($\theta_1$ and $\theta_2$) for two respective overlapping sets of grooves, such as 21, 23, 25, etc., and 22, 24, 26, etc., shown in FIG. 3. As can be seen from a comparison of FIGS. 1 and 4, the temperature range over which the signal loss characteristic remains substantially flat (without drop-off) is considerably widened by employing a multiangle grating configuration as illustrated in FIG. 3, described above.

In the foregoing embodiment, the invention has been described in connection with a configuration wherein two different ($\theta_1$ and $\theta_2$) angular grating angular orientations are combined to obtain a broadened, flat signal loss-versus-temperature profile. However, the multiangle technique of the present invention is not limited to only two different angles, but may be applied to three, four, or more angular orientations of respective sets of gratings that are arranged to overlap one another and thereby create an expanded signal loss-temperature profile.

Formation of the grating groove patterns 20 and 30 may be carried out in a straightforward manner, using conventional photolithographic processing techniques commonly employed in the manufacture of reflective array devices. For example, upon the planar surface of a substrate, such as ST-quartz, there may be deposited a layer of metal of the thickness desired to establish a wave reflective discontinuity. Next, a layer of photoresist material is formed on the surface of the metal layer and an inverse grating pattern image may be projected upon the photo-resist. After the photoresist has been developed, an etchant is applied to the substrate structure to remove the metal unmasked by the photoresist pattern. After the etchant has removed all the exposed metal, the remaining photoresist is removed with an appropriate solvent, and the metallic pattern left on the substrate surface is then used as a groove forming mask. To this end, the groove grating may be formed by placing the structure in a suitable sputter etching chamber or a neutralized ion beam apparatus. By virtue of the metal mask pattern, a plurality of grooves will be etched in the surface of the substrate to yield the desired surface discontinuity configuration. Removal of the metal by a suitable etchant leaves the surface of the ST-quartz grooved, as shown in FIG. 3, for example. Appropriate transducers, such as 28 and 38, may then be attached to the substrate.

Figure 5:
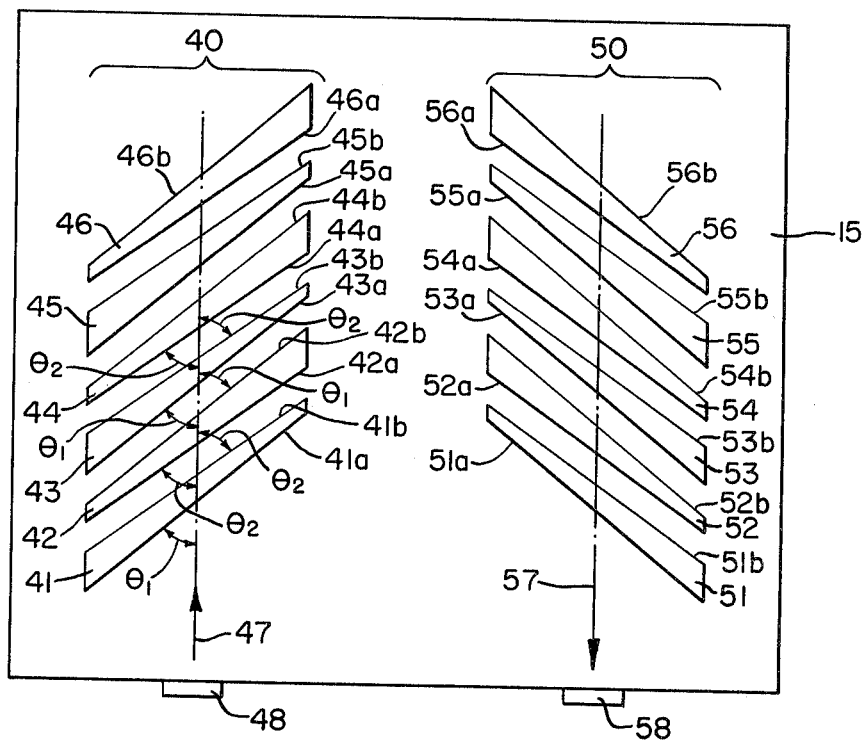
FIGS. 5 through 7 depict respective configurations of multiangled ribbed grating patterns of a reflective array device in accordance with the present invention.

FIG. 5 depicts a further embodiment of the present invention wherein the multiangle oriented grating is formed of a plurality of metallic ribs selectively provided on the surface of a substrate, again, such as an ST-quartz substrate 15. As in FIG. 3, two such grating patterns 40 and 50 are depicted in FIG. 5, grating pattern 40 being comprised of a plurality of ribs, of which six ribs 41 through 46 are shown, each rib being inclined relative to a direction 47 of transmission of a surface acoustic wave propagated from a suitable transmitter 48 disposed at a first portion of substrate 15. As in the embodiment shown in FIG. 3, transmitting transducer 48 may be edge-bonded to substrate 15, as shown, or may be provided on the surface of substrate 15 in an interdigital configuration. Transmitting transducer 48 launches a surface acoustic wave in a direction 47, which wave intersects with grating 40 to be reflected toward grating 50.

Like grating 40, grating 50 may be comprised of a plurality of ribs, again six of which, 51 through 56, are shown, each being inclined relative to a direction 57 toward receiver transducer 58. Grating 50 is disposed so as to cause surface acoustic waves reflected by grating 40 to be reflected along direction 57 towards receiver transducer 58. Receiver transducer 58 may be suitably edge-bonded to substrate 15, as shown, or may be interdigitally coupled to the surface of substrate 15.

In order to achieve a broadened, flat signal loss-versus-temperature characteristic, as is achieved with the multi-angle groove pattern described above, rib patterns 40 and 50 are formed of trapezoidally shaped ribs oriented so that opposing edges of adjacent ribs are parallel to one another. More specifically, and considering grating pattern 40, the opposing edges of adjacent ribs, such as edge 41b of rib 41 and edge 42a of rib 42 are parallel with one another and intersect propagation direction 47 at an angle $\theta_1$. Similarly, opposing edges 42b of rib 42 and 43a of rib 43 are parallel with one another and intersect propagation direction 47 at an angle $\theta_2$, where $\theta_2 \neq \theta_1$. Where all of the trapezoidally shaped ribs are identically shaped, there is obtained a multiangle grating orientation pattern of two angles $\theta_1$ and $\theta_2$, with every other trapezoidal rib being oriented relative to propagation direction 47 in the same manner. Adjacent ones of the ribs, such as ribs 42 and 43, are oriented so that the narrow end of one rib is adjacent the wide end of the other rib, as shown. As a result a discontinuity pattern, similar to that provided by grooved grating patterns 20 and 30 shown in FIG. 3, is obtained, having a signal loss profile as depicted in FIG. 4.

As is the case with the embodiment of the invention shown in FIG. 3, the number of different angles chosen need not be limited to the two shown in FIG. 5 but may be increased to provide the desired signal loss-temperature profile described by arranging alternate or interleaved sets of differently shaped trapezoidal ribs in a periodic fashion along propagation direction 47.

As will be appreciated from the previous description of FIG. 3 and the configuration of ribbed grating 40 of FIG. 5, ribs, such as ribs 51 through 56 of ribbed grating 50, may be oriented in a manner corresponding to the orientation of ribbed grating pattern 40, as shown, to provide a signal loss-temperature profile which corresponds to that of grating pattern 40. Thus, for example, opposing edges 51b of rib 51 and 52a of rib 52 are parallel with one another and intersect wave propagation direction 57 at an angle $\theta_1$, while opposing edges 52b of rib 52 and 53a of rib 53 are parallel with one another and intersect direction 57 at angle $\theta_2$. Alternate pairs of opposing edges of adjacent ribs of grating 50 are parallel, so that edge pairs 51b, 52a, 53b, 54a, 55b, 56a, etc., are parallel at angle $\theta_1$, and edge pairs 52b, 53a, 54b, 55a, etc., are parallel at angle $\theta_2$, just as edge pairs 41b, 42a, 43b, 44a, 45b, 46a, etc., of grating 40 are parallel at angle $\theta_2$.

In the embodiment of the invention shown in FIG. 5, the trapezoidally shaped ribs are arranged such that opposing edges of adjacent ribs are parallel with each other. In a modification of this configuration, shown in FIG. 6, each of the trapezoidally shaped ribs of a grating pattern, such as grating pattern 40 or 50, is oriented in the same manner so that opposing edges of adjacent ribs are inclined relative to each other and corresponding edges of adjacent ribs are parallel with each other. Namely, opposing edges of each pair of adjacent ribs, such as edges 61b of rib 61 and 62a of rib 62, edge 62b of rib 62, and edge 63a of rib 63, etc., are oriented at respective angles $\theta_2$ and $\theta_1$, respectively. Similarly, the opposing edges of the ribs making up grating pattern 70 are oriented in a like manner, thus edges 71b, 72b, 73b, 74b, etc., of ribs 71, 72, 73, 74, etc., are parallel with each other and are oriented at an angle $\theta_2$ relative to direction 77, while edges 71a, 72a, 73a, 74a, etc., of ribs 71, 72, 73, 74, etc., are parallel with each other oriented at an angle $\theta_1$ relative to direction 77. In this case however, the non-symmetric spacings between the ribs may cause wavefront distortion of a wave transmitted from transducer 68, reflected off gratings 60 and 70 and received at transducer 78. To diminish or eliminate this wavefront distortion, an arrangement as shown in FIG. 7 may be employed.

In accordance with this modified configuration, the trapezoidally-shaped ribs are oriented in pairs with alternate pairs being inclined relative to a propagation axis in different respective directions. As shown in FIG. 7, trapezoidally-shaped ribs 81 and 82 are arranged so that corresponding edges 81a and 82a are parallel with each other inclined at an angle $\theta_1$, relative to propagation axis 87. Similarly, edges 81b and 82b of ribs 81 and 82, respectively, are parallel with each other but inclined at an angle $\theta_2$ relative to propagation direction 87. Ribs 83 and 84, which form a pair of ribs adjacent to pair 81 and 82, are oriented so that corresponding edges 83a, 84a are parallel to each other but oriented at angle $\theta_2$ relative to axis 87, while edges 83b and 84b are oriented at angle $\theta_1$, relative to axis 87. Ribs 85 and 86 are oriented in a manner similar to ribs 81 and 82 so that the grating 80 is effectively formed of pairs of ribs arranged in an alternating-pair manner similar to the singular rib alternating arrangement shown in FIG. 5, described previously. Of course, the ribs of grating 90 are oriented in a corresponding alternating pair arrangement as shown. Thus, the parallel ribs 91, 92 of rib pair 91–92 are parallel to ribs 95, 96 interleaved between which are ribs 93, 94 oriented opposite to rib pair 91, 92 and 95, 96. Again, as is the case for the multiangular orientations depicted in FIGS. 3, 5, and 6, the number of angles employed for achieving the broad, flattened signal loss-temperature profile need not be limited to two ($\theta_1$ and $\theta_2$ in the example depicted) but may be increased to three, four, etc., to obtain the profile desired.

Figure 6:
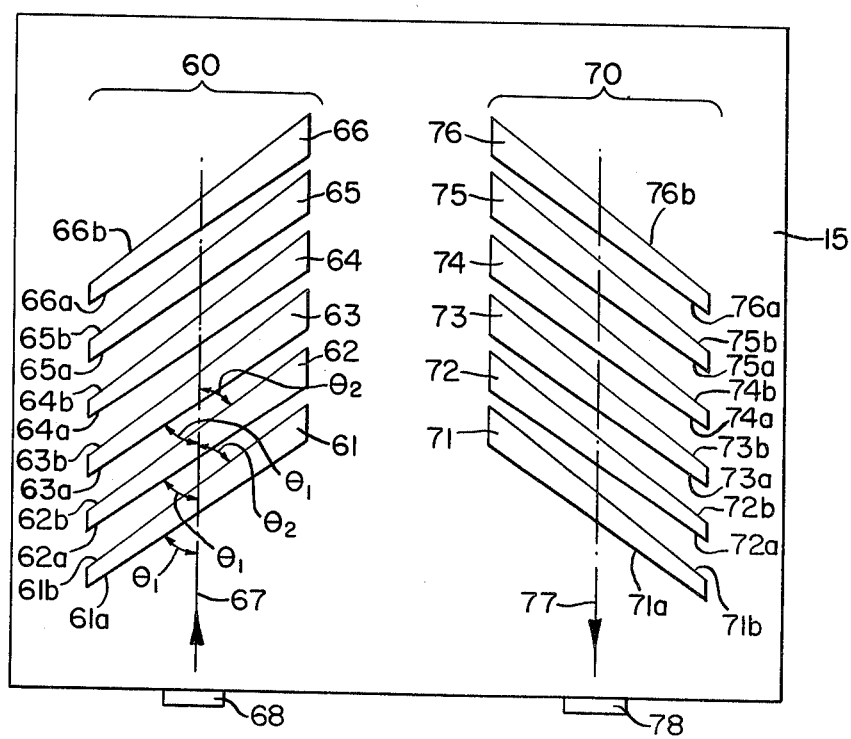
Figure 7:
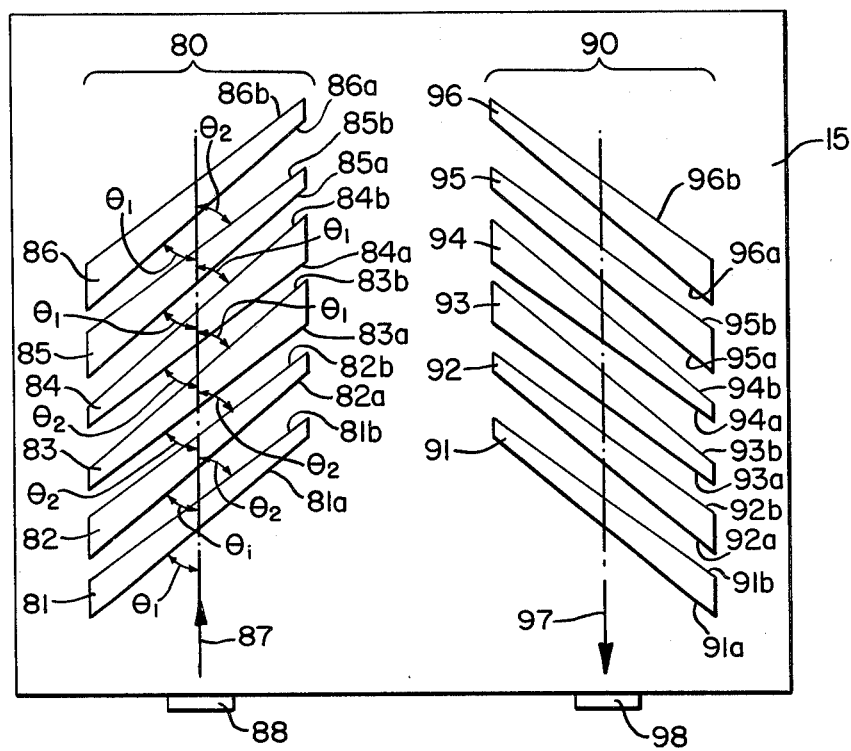

Formation of the ribbed grating configuration, as illustrated in FIGS. 5, 6, and 7 may be carried out by using conventional photolithographic techniques as described previously in connection with the formation of the grooved grating, as shown in FIG. 3. For example, a metallic layer of the thickness desired is deposited on the top surface of a substrate. A layer of photoresist material is then formed on the metal layer and a photographic image of the desired rib or grating pattern is projected upon the photoresist to expose the pattern upon development. The substrate structure is then subjected to an etch to remove the exposed metal unmasked by the developed photoresist pattern. After the exposed metal is etched away, the remaining photoresist is removed with an appropriate solvent, the metallic pattern remaining being the inteded grating pattern.

Figure 2:
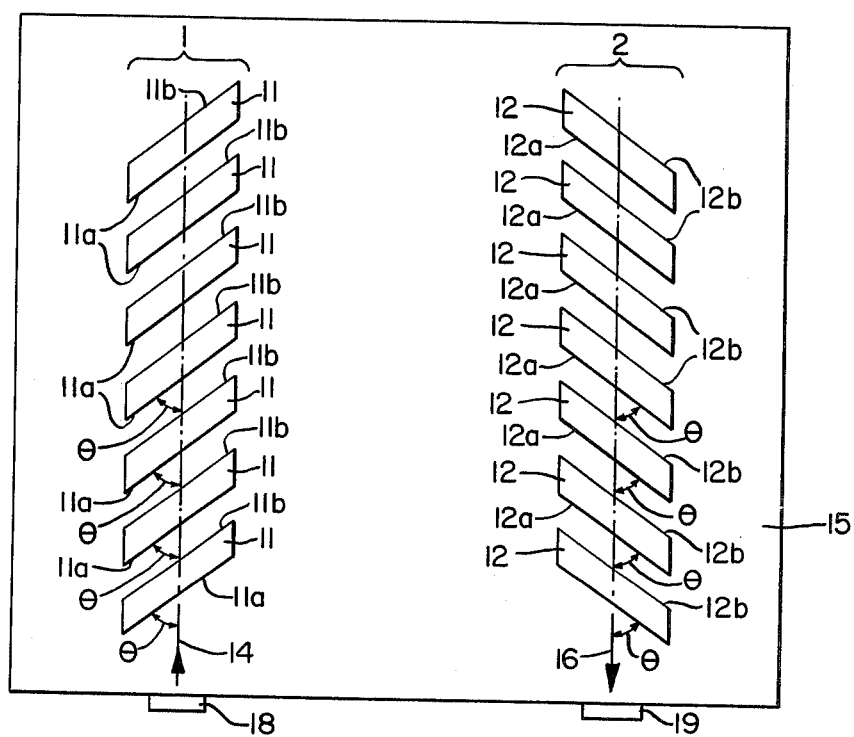
FIG. 2 depicts a grating stripe pattern of a conventional reflective array filter.

As a further modification of the rib or groove embodiments described above, the metallic ribs or grooves may be replaced by arrays of random dots of discontinuity creating metallic layer portions or groove portions confined to the same area used for the grooves or metal strip reflective elements. The U.S. Pat. No. 4,055,820 to Solie shows the use of dot arrays in a conventional reflective array arrangement similar to the continuous stripe element configuration of FIG. 2, and reference may be had to this patent or to an article by Solie et al entitled "A SAW Pulse Compression Filter Using the Reflective Dot Array (RDA)", published in Applied Physics Letters, Vol. 31, No. 1, July 1, 1977, pages 1 through 3, for a more detailed explanation of dot arrays, per se.

Figure 8:
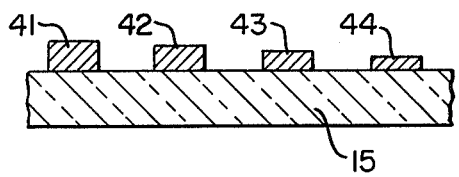
FIGS. 8 and 9 are respective cross-sections of amplitude weighted rib and groove portions of a reflective array filter.
Figure 9:
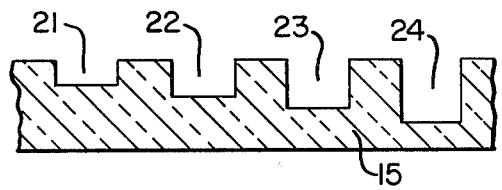

An advantage of the dot array approach is that the frequency response can be amplitude weighted by varying the density of the dots. In order to amplitude weight a metal stripe or rib-configured grating, it is necessary to vary the thickness of the metallization ribs; similarly, amplitude weighting of a groove-configured grating requires that the groove depth (which depends upon the etch time) be varied. FIGS. 8 and 9 are more respective illustrations of cross sections (along the acoustic wave propagation path) of grating ribs and grooves respectively which are gradually tapered or varied in thickness along the SAW propagation path to achieve the desired amplitude weighting. As is shown in FIG. 8, the thickness of the ribs, such as ribs 41, 42, etc. of of grating 40, illustrated in FIG. 5, may be varied from a relatively thick rib 41 to a thinner rib 42 and further thinner ribs 43, etc. Similarly, the depths of the grooves, such as the grooves of grating 20 of the configuration shown in FIG. 3, may be varied from a relatively shallow groove 21 to a deeper groove 22 and even deeper grooves 23, etc., as shown in FIG. 9.

Figure 10:
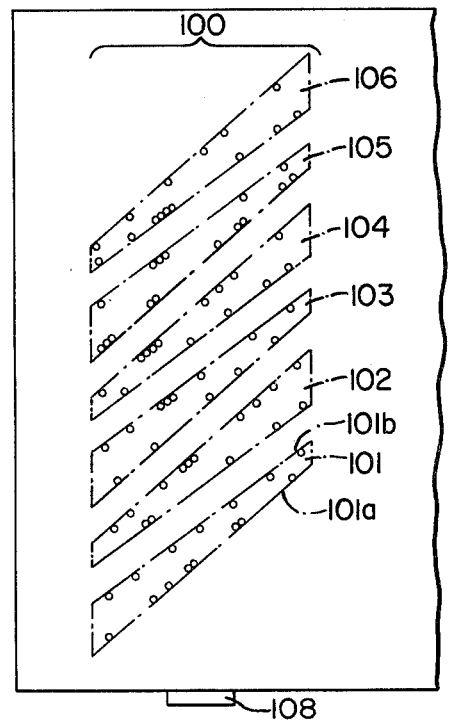
FIG. 10 illustrates a distributed dot array multi-angle grating pattern of a reflective array device in accordance with the present invention.

In order to simplify the manner of amplitude weighting the grating stripes, the mask used for forming the dot pattern of each stripe is appropriately designed and thereafter the photolithographic steps described above for forming the metallic rib structure are carried out. FIG. 10 illustrates a reflective array grating comprised of a plurality of surface discontinuity-creating dot arrays 101 through 106 patterned as a plurality of interleaved trapezoidal shapes, similar to grating 40 shown in FIG. 5, but being comprised of randomly distributed dots of metallic material confined within trapezoidally shaped reflection areas such as areas 101 through 106, thereby forming a multiangular reflective array that provides both a broad, flat signal loss-temperature profile as illustrated in FIG. 4, and an amplitude weighted frequency response characteristics in accordance with the density distribution of the dot array in the trapezoidal areas. Thus, a surface acoustic wave injected into the surface of substrate 15 in response to the application of an input signal to transducer 108 will travel along direction 107 and be reflected from array 100. Another dot array (not shown) and appropriate receiving transducer (not shown) similar to those for the embodiments described previously may be provided for coupling the acoustic wave reflected by array 100 to the output transducer and for generating an output signal, the frequency response of which has been amplitude weighted by the dot array density distribution in the dot-containing trapezoidal areas of the gratings.

As will be appreciated from the foregoing description of various embodiments of the present invention, there is provided a new and improved reflective array filter for surface acoustic wave devices, the angle of which is effectively distributed, to thereby increase the temperature range over which signal loss is substantially invariable, thereby compensating for sensitivity of SAW transmitting material such as ST-quartz to variations in temperature.

While we have shown and described several embodiments in accordance with the present invention, it is understood that the same is not limited thereto but is susceptible of numerous changes and moficiations as known to a person skilled in the art, and we therefore do not wish to be limited to the details shown and described herein but intend to cover all such changes and modifications which are obvious to one of ordinary skill in the art.

We claim:

1. In a surface acoustic wave device comprising a substrate capable of supporting acoustic waves at a surface thereof, and a reflective array grating formed of a plurality of acoustic wave-reflective elements, the boundaries of which elements create reflective discontinuities along the surface of said substrate, disposed at said surface of said substrate, a boundary of each element defining a respective grating angle relative to a prescribed direction of acoustic propagation, the improvement wherein
said plurality of elements is comprised of plural sets of said elements, the elements of one of said sets having a discontinuity-creating boundary the grating angle of which differs from the grating angle of a discontinuity-creating boundary of the elements of another of said sets, and wherein the elements of said sets are interleaved with one another along said prescribed direction of acoustic propagation, so that an acoustic wave traveling along said prescribed direction encounters the boundaries of differing grating angles of each of the elements of said plural sets and thereafter repeatedly encounters the boundaries of different grating angles of each of the elements of said plural sets.

2. The improvement according to claim 1, wherein the adjacent grating angle-defining boundaries of an individual element are parallel with each other.

3. The improvement according to claim 1, wherein the adjacent grating angle-defining boundaries of an individual element are non-parallel with each other.

4. The improvement according to claim 1, wherein the adjacent grating angle-defining boundaries of adjacent ones of said elements are parallel with each other.

5. The improvement according to claim 1, wherein the adjacent grating angle-defining boundaries of adjacent ones of said elements are non-parallel with each other.

6. The improvement according to claim 1, wherein said elements are configured as respective grooves formed in said surface of said substrate.

7. The improvement according to claim 1, wherein said elements are configured as layers of acoustic wave-reflective discontinuity-creating material formed on said surface of said substrate.

8. The improvement according to claim 7, wherein each element is formed of a continuous layer of said material.

9. The improvement according to claim 7, wherein each element is formed of a distributed multiplicity of discrete dot-like scatterers formed of said material.

10. The improvement according to claim 7, wherein said layers of material are formed of metallic layers.

11. The improvement according to claim 1, wherein said substrate is made of ST-quartz.

12. The improvement according to claim 6, wherein each of said grooves has first and second parallel sides.

13. The improvement according to claim 7, wherein each of said layers of material has first and second sides oriented at respectively different angles relative to said direction of propagation.

14. The improvement according to claim 9, wherein the distributed multiplicity of discrete dot-like scatterers of which each element is formed are confined within an areal pattern having a pair of opposite sides that are oriented at respectively different angles relative to said direction of propagation.

15. The improvement according to claim 1, wherein the structural configurations of each of said elements is such that the frequency response of said array is amplitude weighted along said grating in the acoustic wave propagation direction.

16. The improvement according to claim 1, further comprising an input transducer for launching surface acoustic waves in said prescribed propagation direction on said surface of said substrate.

17. The improvement according to claim 16, further comprising an output transducer for receiving acoustic waves reflected by reflective array grating.

18. The improvement according to claim 9, wherein the distribution of said multiplicity of discrete dot-like scatterers of material is such as to cause the frequency response of said array to be amplitude weighted along said grating.

19. The improvement according to claim 14, wherein said dot-like scatterers are randomly distributed along the opposite sides of said areal pattern.

20. In a surface acoustic wave device comprising a substrate capable of supporting acoustic waves at a surface thereof, and a reflective array grating formed of a plurality of acoustic wave-reflective elements, the boundaries of which elements create reflective discontinuities along the surface of said substrate, disposed at said surface of said substrate, a boundary of each element defining a respective grating angle relative to a prescribed direction of acoustic propagation, a method of flattening the signal loss characteristic of said array relative to changes in temperature comprising:
orienting said elements to define relatively different interleaved grating angles among plural ones of said elements by arranging said plurality of elements as plural sets of said elements, the elements of one of said sets having a discontinuity-creating boundary, the grating angle of which differs from the grating angle of a discontinuity-creating boundary of the elements of another of said sets, and wherein the elements of said sets are interleaved with one another along said prescribed direction of acoustic propagation, so that an acoustic wave traveling along said prescribed direction encounters the boundaries of differing grating angles of each of the elements of said plural sets and thereafter repeatedly encounters the boundaries of differing grating angles of each of the elements of said plural sets.

21. The method according to claim 20, wherein the adjacent grating angle-defining boundaries of an individual element are parallel with each other.

22. The method according to claim 20, wherein the adjacent grating angle-defining boundaries of an individual element are non-parallel with each other.

23. The method according to claim 20, wherein the adjacent grating angle-defining boundaries of adjacent ones of said elements are parallel with each other.

24. The method according to claim 20, wherein the adjacent grating angle-defining boundaries of adjacent ones of said elements are non-parallel with each other.

25. The method according to claim 20, wherein said elements are configured as respective grooves formed in said surface of said substrate.

26. The method according to claim 20, wherein said elements are configured as layers of acoustic wave-reflective discontinuity-creating material formed on said surface of said substrate.

27. The method according to claim 20, wherein said substrate is made of ST-quartz.

28. The method according to claim 26, wherein each element is formed of a continuous layer of said material.

29. The method according to claim 26, wherein each element is formed of a distributed multiplicity of discrete dot-like scatterers formed of said material.

30. The method according to claim 25, wherein each of said grooves has first and second parallel sides.

31. The method according to claim 26, wherein each of said layers of material has first and second sides oriented at respectively different angles relative to said direction of propagation.

32. The method according to claim 29, wherein the distributed multiplicity of discrete layer segments of which each element is formed are confined within an areal pattern having a pair of opposite sides that are oriented at respectively different angles relative to said direction of propagation.

33. The method according to claim 29, wherein the distribution of said multiplicity of discrete dot-like scatterers of material is such as to cause the frequency response of said array to be amplitude weighted along said grating.

34. The method according to claim 20, further comprising the step of configuring each of said elements such that the frequency response of said array is amplitude weighted along said grating.

35. The method according to claim 32, wherein said dot-like scatterers are randomly distributed along the opposite sides of said areal pattern.

* * * * *